(12) United States Patent
Yamamoto et al.

(10) Patent No.: US 10,224,278 B2
(45) Date of Patent: Mar. 5, 2019

(54) SEMICONDUCTOR DEVICE WITH ANTI-FUSE COMPONENT INCLUDING ELECTRODE OVER CORNER OF INSULATING MEMBER

(71) Applicant: KABUSHIKI KAISHA TOSHIBA, Tokyo (JP)

(72) Inventors: Takeshi Yamamoto, Kanagawa (JP); Osamu Takata, Kanagawa (JP); Mariko Habu, Tokyo (JP); Shinji Kawahara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/444,682

(22) Filed: Feb. 28, 2017

(65) Prior Publication Data

US 2018/0061755 A1    Mar. 1, 2018

Related U.S. Application Data

(60) Provisional application No. 62/382,385, filed on Sep. 1, 2016.

(51) Int. Cl.
  *H01L 23/485*    (2006.01)
  *H01L 23/525*    (2006.01)
  *H01L 27/112*    (2006.01)

(52) U.S. Cl.
  CPC ........ *H01L 23/5252* (2013.01); *H01L 23/485* (2013.01); *H01L 27/11206* (2013.01)

(58) Field of Classification Search
  None
  See application file for complete search history.

(56) References Cited

U.S. PATENT DOCUMENTS

| | | | |
|---|---|---|---|
| 8,159,040 B2 | 4/2012 | Coolbaugh et al. | |
| 2003/0098495 A1* | 5/2003 | Amo | H01L 23/5252 257/530 |
| 2007/0045679 A1* | 3/2007 | McKee | H01L 27/14603 257/291 |
| 2007/0222028 A1 | 9/2007 | Matsuoka et al. | |
| 2008/0197387 A1* | 8/2008 | Itonaga | H01L 27/14603 257/292 |
| 2010/0078699 A1 | 4/2010 | Nakano | |
| 2014/0231895 A1* | 8/2014 | Rothleitner | H01L 29/4238 257/315 |
| 2016/0141295 A1* | 5/2016 | Wu | H01L 27/11206 365/96 |

FOREIGN PATENT DOCUMENTS

| | | |
|---|---|---|
| JP | 2007266061 A | 10/2007 |
| JP | 2010087357 A | 4/2010 |
| JP | 2011523507 A | 8/2011 |

* cited by examiner

*Primary Examiner* — Erik Kielin
(74) *Attorney, Agent, or Firm* — Kim & Stewart LLP

(57) ABSTRACT

A semiconductor device includes a semiconductor substrate comprising an upper layer portion, a first insulating member located in the upper layer portion of the semiconductor substrate and having one or more corner portions, an electrode located on the semiconductor substrate, wherein the electrode overlies at least one of the corner portions of the first insulating member, and an insulating film located between the semiconductor substrate and the electrode.

7 Claims, 7 Drawing Sheets

SEMICONDUCTOR DEVICE WITH ANTI-FUSE COMPONENT INCLUDING ELECTRODE OVER CORNER OF INSULATING MEMBER

CROSS-REFERENCE TO RELATED APPLICATIONS

This application claims benefit of U.S. provisional patent application Ser. No. 62/382,385, filed Sep. 1, 2016, which is herein incorporated by reference.

FIELD

Embodiments relate to a semiconductor device.

BACKGROUND

An anti-fuse element utilizing an MOSFET structure is sometimes provided in a semiconductor device. In such an anti-fuse element, a gate electrode and a semiconductor substrate are insulated from each other by a gate insulating film in an initial state, however, when breakdown occurs in the gate insulating film by applying a predetermined voltage, the gate electrode and the semiconductor substrate are electrically connected to each other. As a result, a connection relationship of interconnects is selected.

DETAILED DESCRIPTION

A semiconductor device according to an embodiment includes a semiconductor substrate comprising an upper layer portion, a first insulating member located in the upper layer portion of the semiconductor substrate and having one or more corner portions, an electrode located on the semiconductor substrate, wherein the electrode overlies at least one of the corner portions of the first insulating member, and an insulating film located between the semiconductor substrate and the electrode.

First Embodiment

First, a first embodiment will be described.

Figure 1A:
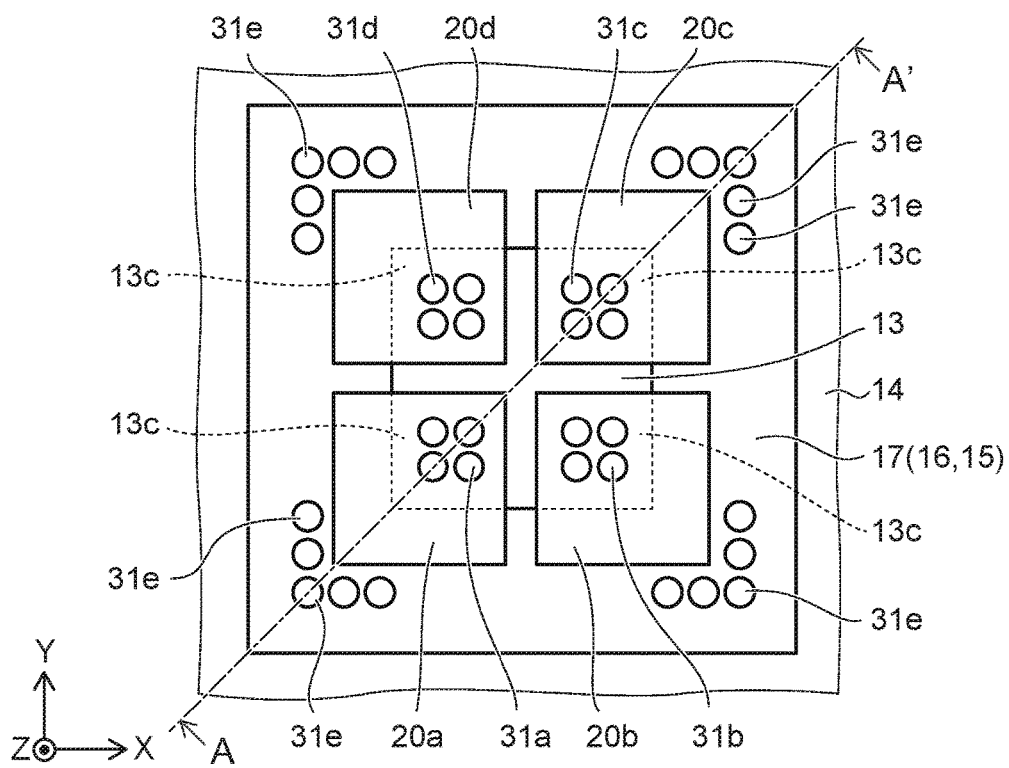
FIG. 1A is a plan view showing a semiconductor device according to a first embodiment.
Figure 1B:
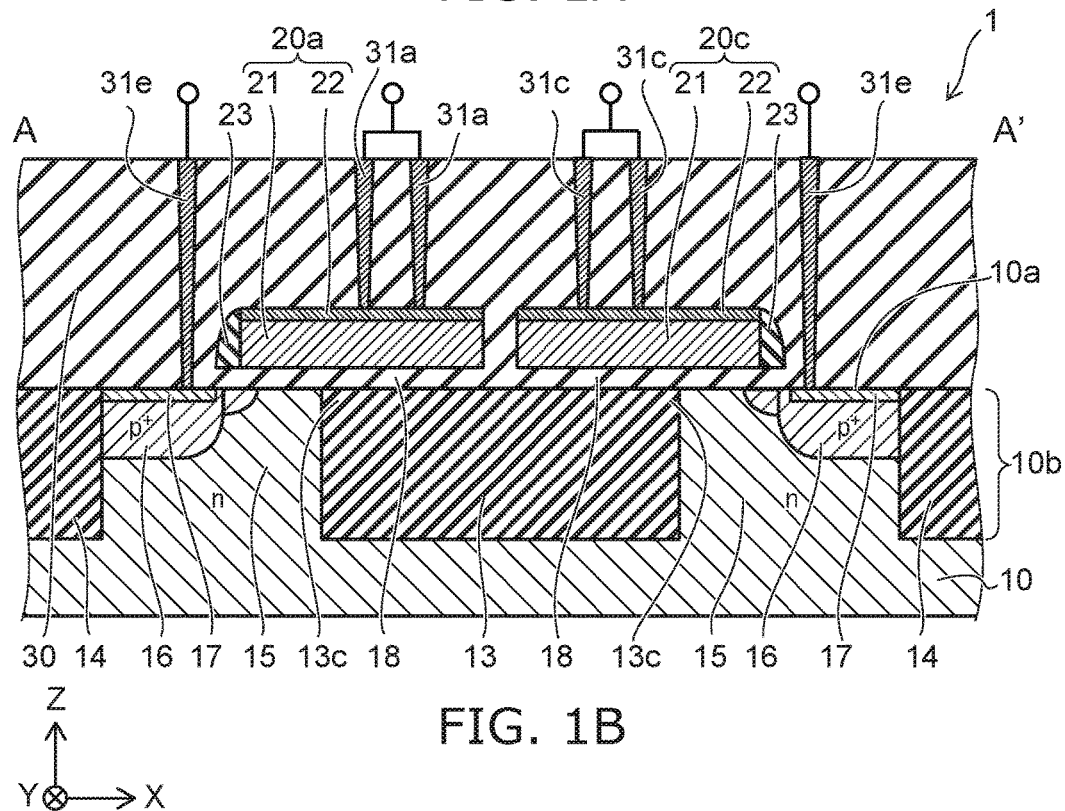
FIG. 1B is a sectional view taken along a line A-A' shown in FIG. 1A.

FIG. 1A is a plan view showing a semiconductor device according to the embodiment, and FIG. 1B is a sectional view taken along a line A-A' of the semiconductor device shown in FIG. 1A.

The semiconductor device according to the embodiment is a semiconductor device including a gate insulating film breakdown-type anti-fuse element (eFuse).

As shown in FIGS. 1A and 1B, in a semiconductor device 1 according to the embodiment, a silicon substrate 10 is provided. The silicon substrate 10 is formed of, for example, a silicon (Si) single crystal. Hereinafter, in the specification, for the sake of convenience of description, an XYZ orthogonal coordinate system is adopted. Two directions parallel to an upper surface 10a of the silicon substrate 10 and also orthogonal to each other are referred to as the "X-direction" and the "Y-direction", and a direction perpendicular to the upper surface 10a of the silicon substrate 10 is referred to as the "Z-direction". Further, in the Z-direction, one side is referred to as "upper", and the other side is referred to as "lower", however, these expressions are for reference only, and are irrelevant to the direction of gravity.

The conductivity type of an upper layer portion 10b of the silicon substrate 10 is, for example, n-type. In the upper layer portion 10b, a STI structure (Shallow Trench Isolation) 13 and an STI 14 composed of, for example, silicon oxide (SiO) are provided. The shape of the STI 13 as viewed from above (in the Z-direction) is a shape with one or more corner portions and is, for example, a polygon, for example, a quadrangle, and more specifically, for example, a rectangle. Sides of this rectangle extend in the X-direction and the Y-direction.

Further, the STI 14 is located so as to surround the STI 13 as viewed from above. That is, the STI 14 extends around and thus partitions, for example, a rectangular region including the STI 13, in the upper layer portion 10b of the silicon substrate 10. The sides of the rectangular region extend in the X-direction and the Y-direction. The STI 14 is spaced from the STI 13 in the X-direction and the Y-direction. In the upper layer portion 10b, a frame-shaped region interposed between the STI 13 and the STI 14 is called an "active area 15".

On the active area 15, a gate insulating film 18 composed of, for example, silicon oxide is provided. The gate insulating film 18 is formed by, for example, the same process as that for a gate insulating film of a MOSFET (not shown) formed in the semiconductor device 1. Over the gate insulating film 18 on the STI 13, for example, are provided four gate electrodes 20a to 20d (hereinafter, also collectively referred to as "gate electrode 20"). Between the active area 15 and the gate electrode 20, a part of the gate insulating film 18 is disposed.

In each gate electrode 20, a silicon layer 21 composed of polysilicon is provided, and on the silicon layer 21, a silicide layer 22 composed of a silicide, for example, nickel silicide (NiSi) is provided. Further, on a side surface of the gate electrode 20, a side wall 23 composed of an insulating material is provided. The gate electrode 20 and the side wall 23 are formed by, for example, the same process as that for a gate electrode and a side wall of the MOSFET (not shown) formed in the semiconductor device 1.

The shape of each gate electrode 20 as viewed from above is a rectangle. Further, the four gate electrodes 20 are arranged in a 2×2 matrix in the X-direction and the Y-direction. Each gate electrode 20 overlies a different corner portion 13c of the STI 13 as viewed from above. That is, one of each of the four gate electrodes 20 is disposed immediately above one of the four corner portions 13c of the STI 13.

A layout of the STI 13 and the gate electrodes 20 is, for example, one of four-fold symmetry.

Further, in a region of the active area 15 spaced from the STI 13 in the x and y directions, an impurity-containing layer 16 is provided. The impurity-containing layer 16 is in contact with the STI 14, and a majority of the impurity-containing layer 16 is disposed in a region of the active area 15 except that region immediately below the gate electrode 20. The conductivity type of the impurity-containing layer 16 is, for example, p$^+$-type. In an upper layer portion of the impurity-containing layer 16, a silicide layer 17 composed of, for example, nickel silicide is provided. The impurity-containing layer 16 is formed by, for example, the same process as that for a source-drain layer of a p-channel type MOSFET (not shown) formed in the semiconductor device 1.

On the silicon substrate 10, an interlayer insulating film 30 is provided so as to cover the gate electrodes 20. In the interlayer insulating film 30, a plurality of contacts 31a to 31e extending in the Z-direction are provided. The contacts 31a to 31d are connected to the gate electrodes 20a to 20d, respectively. The contacts 31e are connected to the silicide layer 17. Incidentally, in FIG. 1A, in order to make the drawing easier to understand, the illustration of the side wall 23 and the interlayer insulating film 30 is omitted.

In this manner, between the active area 15 and each gate electrode 20, an anti-fuse element is formed. In the embodiment, four anti-fuse elements are formed with respect to one active area 15. As described later herein, the four anti-fuse elements can be used independently, and also can be used collectively as one anti-fuse element. In an initial state, the anti-fuse element is in an insulating state, i.e., a connection from the electrode 20 in the direction of the substrate 10 is not present.

Next, an operation of the semiconductor device according to the embodiment will be described.

Figure 2:
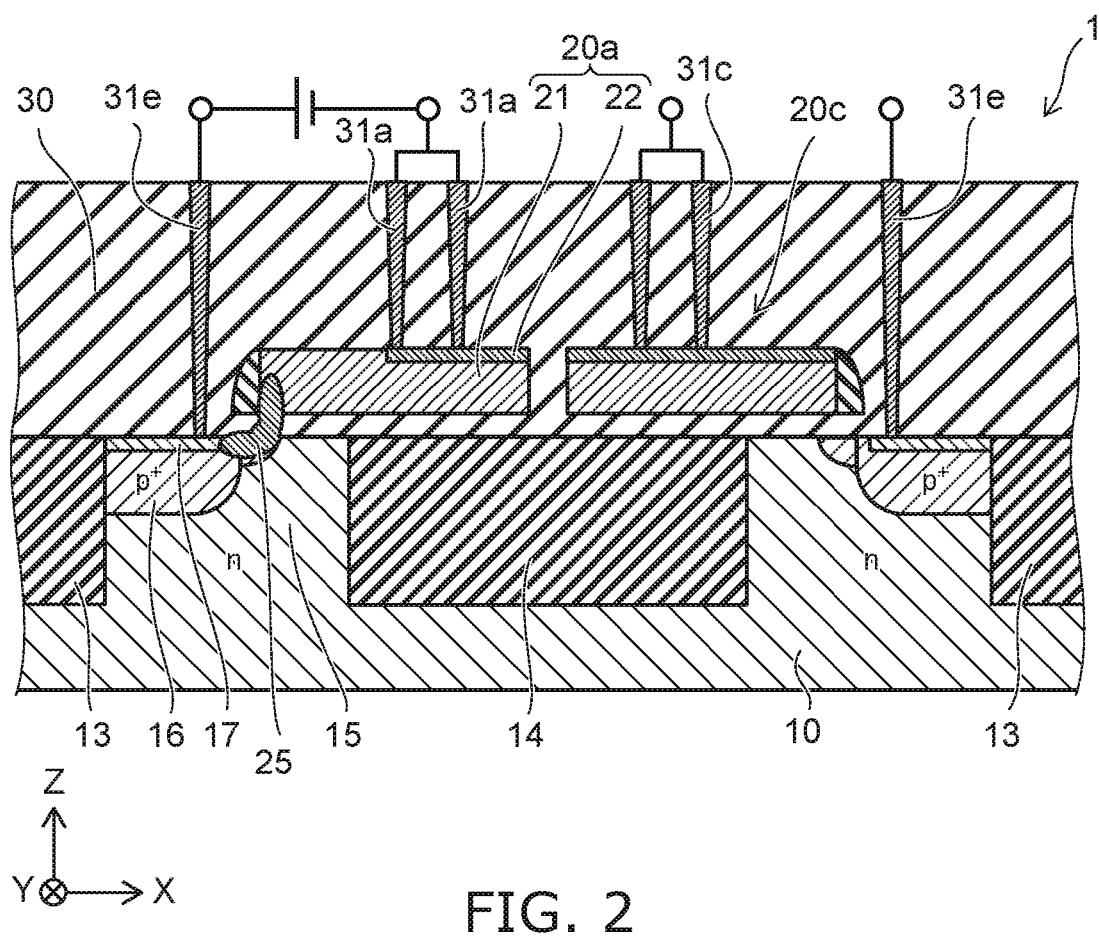
FIG. 2 is a sectional view showing an operation of the semiconductor device according to the first embodiment.

FIG. 2 is a sectional view showing an operation of the semiconductor device according to the embodiment.

As shown in FIG. 2, a write voltage is applied, for example, between the gate electrode 20a and the silicon substrate 10. The write voltage is set to, for example, 7 to 8 V. Specifically, for example, a ground potential is applied to the contact 31a, and a positive write potential is applied to the contact 31e. By doing this, the gate electrode 20a is at the ground potential, and the impurity-containing layer 16 and the active area 15 are at the write potential. Incidentally, the other gate electrodes 20b to 20d are in a floating state, and their potential rises due to a coupling effect thereof with the active area 15.

At this time, between the silicon substrate 10 and the gate electrode 20a, an electric field is concentrated in the vicinity of the corner portion 13c of the STI 13. As a result, electrical breakdown occurs in the gate insulating film 18 in the vicinity of the corner portion 13c, and an electric current flows through approximately the following path of (the contact 31a—the gate electrode 20a—an electrical breakdown portion of the gate insulating film 18—the impurity-containing layer 16—the silicide layer 17—the contact 31e).

As a result, due to electromigration caused by the electric current, metal atoms contained in the silicide layer 22 of the gate electrode 20a move along the current path toward the silicide layer 17 of the impurity-containing layer 16, resulting in a conductive member 25 composed of a silicide being formed. As a result, the gate electrode 20a and the silicon substrate 10 are short-circuited to each other (electrically connected).

In this manner, by short-circuiting an arbitrary gate electrode 20 to the silicon substrate 10, the anti-fuse element is brought to a conducting state. According to this, a custom-made circuit can be fabricated by selecting a connection relationship of interconnects, a redundant circuit can be made effective by connection thereto, or information such as a cryptography key or a product ID can be stored and accessed by the connection thereto.

Incidentally, the gate electrodes 20a to 20d may be used individually as separate electrodes, or may be used as one electrode. In the case where these electrodes are used as separate electrodes, four anti-fuse elements can be realized in one active area 15. According to this, for example, by using the anti-fuse element as a write-once memory element, 4-bit information can be stored. On the other hand, in the case where these electrodes are used as one electrode, by applying the same potential to the contacts 31a to 31d, a write voltage is applied simultaneously between the gate electrodes 20a to 20d and the silicon substrate 10. In this case, the number of anti-fuse elements to be realized in one active area 15 is one, however, if any one of the four gate electrodes 20 is short-circuited, the anti-fuse element is brought to a conducting state, and therefore, the reliability of forming a connection via the anti-fuse element is high.

Next, effects of the embodiment will be described.

As shown in FIGS. 1A and 1B, in the semiconductor device 1 according to the embodiment, the STI 13 in a quadrilateral shape as viewed from above and the four electrodes 20 are provided, and each gate electrode 20 overlies a corner portion 13c of the STI 13. Accordingly, when a write voltage is applied between the silicon substrate 10 and an arbitrary gate electrode 20, an electric field is concentrated in the vicinity of the corner portion 13c which is below the gate electrode 20, and breakdown can be reliably caused in the gate insulating film 18. Due to this, the reliability of the anti-fuse element of the semiconductor device 1 is high. Further, it is not necessary to excessively increase the write voltage for the purpose of reliably causing breakdown in the gate insulating film 18, and therefore, the size of the semiconductor device 1 can be reduced.

Incidentally, in the embodiment, an example in which the shape of the STI 13 is a quadrangle as viewed from above, and the number of gate electrodes 20 is four is shown, however, the invention is not limited thereto. More generally, when n is an integer of 3 or more, the shape of the STI 13 is an n-gonal (n-sided) shape as viewed from above, the number of gate electrodes 20 is n, and each gate electrode 20 overlies one of the corner portions of the STI 13 as viewed from above, i.e., each corner portion of the STI 13 underlies a different one of the gate electrodes 20. Thus, n anti-fuse elements are realized with respect to one STI 13. In this case, in order to make properties of the n anti-fuse elements uniform, the layout of the STI 13 and the gate electrodes 20 is favorably an n-fold symmetry.

Comparative Example

Next, a comparative example will be described.

Figure 3A:
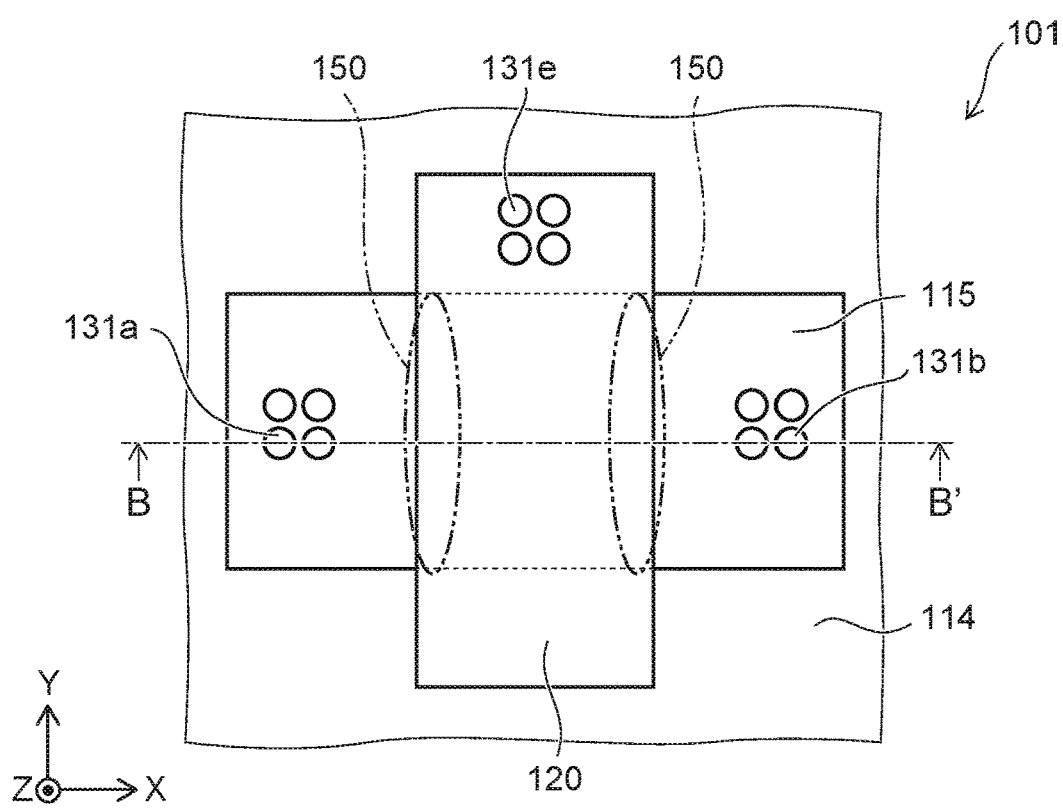
FIG. 3A is a plan view showing a semiconductor device according to a comparative example.
Figure 3B:
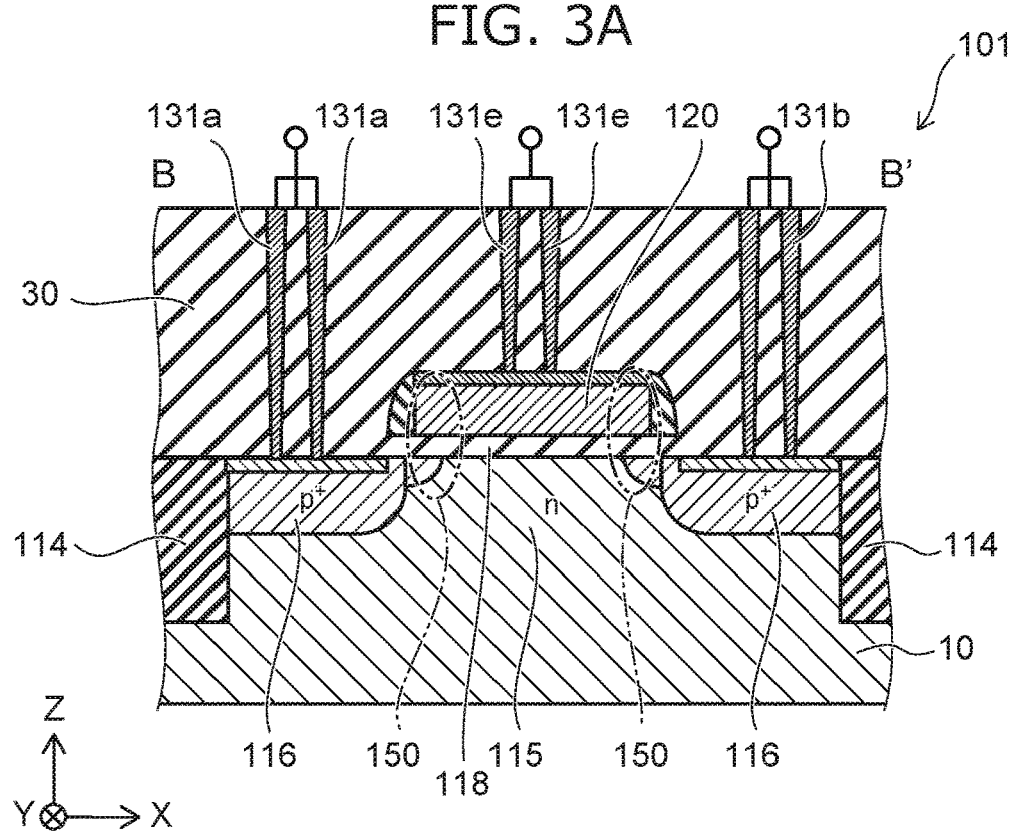
FIG. 3B is a sectional view taken along a line B-B' shown in FIG. 3A.

FIG. 3A is a plan view showing a semiconductor device according to the comparative example, and FIG. 3B is a sectional view taken along a line B-B' shown in FIG. 3A.

As shown in FIGS. 3A and 3B, in a semiconductor device 101 according to the comparative example, an anti-fuse element having a MOS capacitor structure is provided. Specifically, an STI 114 is provided in an upper layer portion of a silicon substrate 10, and an active area 115 is partitioned by the STI 114.

Further, on the silicon substrate 10, a gate electrode 120 is provided. Between the active area 115 and the gate electrode 120, a gate insulating film 118 is provided. Further, on both sides of a region immediately below the gate electrode 120 in the active area 115, a source-drain layer 116 is formed.

The shape of the active area 115 as viewed from above is a rectangle in which the X-direction is taken as a long side of the rectangle direction. On the other hand, a shape of the gate electrode 120 is a rectangle in which the Y-direction is taken as a long side of the rectangle direction. Thus, the gate electrode 120 crosses a central portion in a longitudinal direction of the active area 115. Due to this, as viewed from above, the gate electrode 120 does not overlie a corner portion of the STI 114 and also does not overlie a corner portion of the active area 115.

In the semiconductor device 101, when a write voltage is applied between the silicon substrate 10 and the gate electrode 120, an electric field is concentrated in a region 150 where an end portion of the gate electrode 120 and the active area 115 overlap with each other in the z direction, however, in the region 150, there is no portion where an electric field is concentrated. Due to this, when the gate insulating film 118 is formed a little thicker than a design value because of, for example, an error or the like of a process for manufacturing the semiconductor device 101, even if a predetermined write voltage is applied, breakdown may not occur in the gate insulating film 118. In order to reduce this possibility, it is necessary to increase the write voltage, however, in that case, it is necessary to increase the breakdown voltage of all portions of the semiconductor device 101 to which the write voltage is applied, and therefore, the shrinkage of the semiconductor device 101 is inhibited.

Second Embodiment

Next, a second embodiment will be described.

Figure 4A:
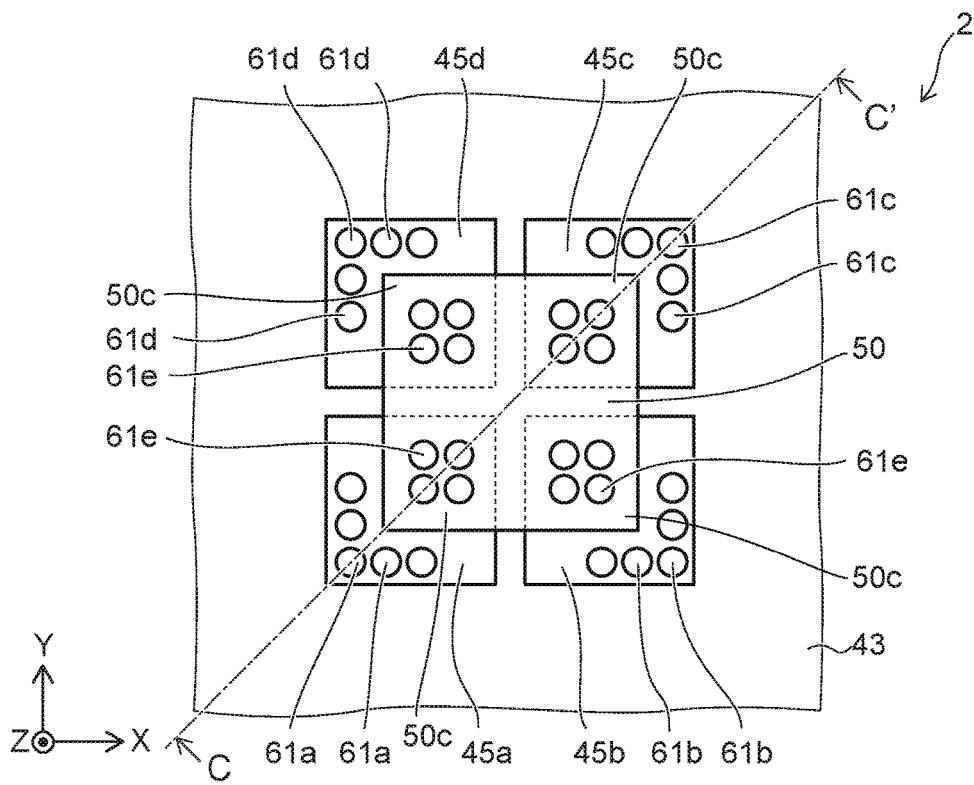
FIG. 4A is a plan view showing a semiconductor device according to a second embodiment.
Figure 4B:
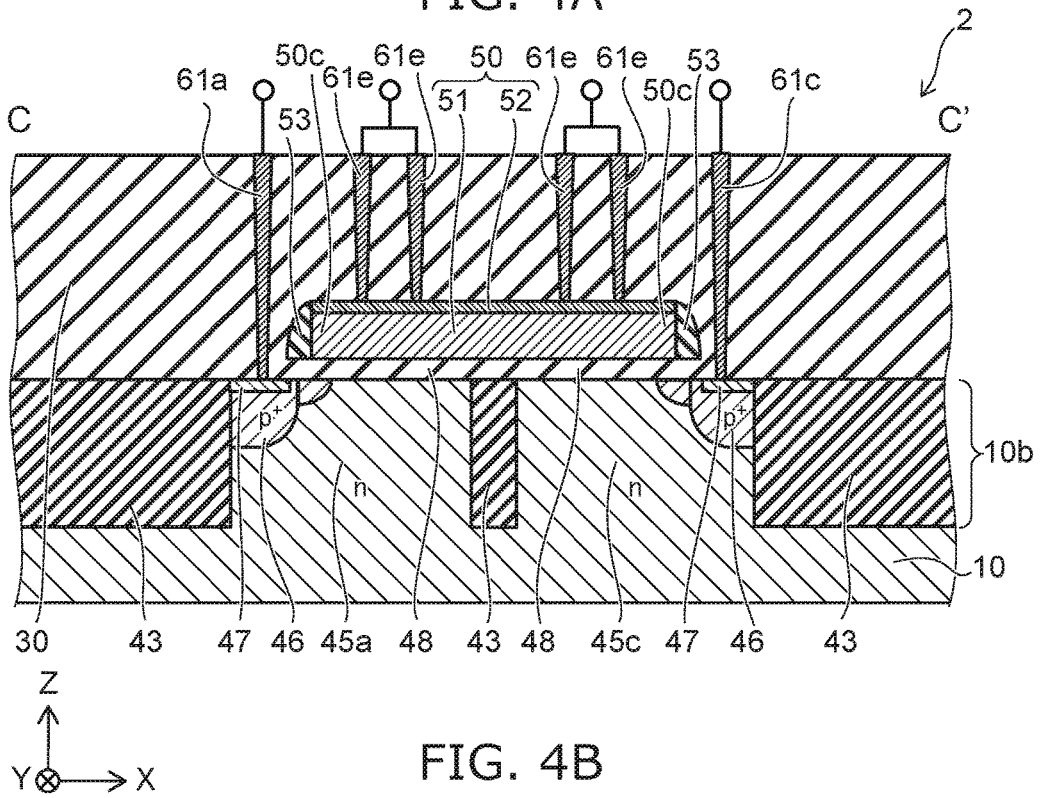
FIG. 4B is a sectional view taken along a line C-C' shown in FIG. 4A.

FIG. 4A is a plan view showing a semiconductor device according to the embodiment, and FIG. 4B is a sectional view of the semiconductor device of FIG. 4A taken along a line C-C' in FIG. 4A.

As shown in FIGS. 4A and 4B, in a semiconductor device 2 according to the embodiment, a STI 43 is selectively provided in an upper layer portion 10b of a silicon substrate 10. In the upper layer portion 10b, four active areas 45a to 45d (hereinafter, also collectively referred to as "active area 45") are partitioned by the STI 43. A shape of each active area 45 as viewed from above is a rectangle. Further, the four active areas 45 are arranged in a 2×2 matrix in the X-direction and the Y-direction. Due to this, in the STI 43, there is a lattice portion as viewed from above and a frame-shaped portion surrounding this latticed portion.

On the active areas 45, a gate insulating film 48 is provided. The gate insulating film 48 is formed by, for example, the same process as that for a gate insulating film of an MOSFET (not shown) formed in the semiconductor device 2. On the gate insulating film 48, one gate electrode 50 is provided. Between the active area 45 and the gate electrode 50, a part of the gate insulating film 48 is disposed.

A shape of the gate electrode 50 as viewed from above (in the Z-direction) is a shape with one or more corner portions and is, for example, a polygon, and for example, a quadrangle, and more particularly, a rectangle. Sides of this rectangle extend in the X-direction and the Y-direction. Thus, each corner portion 50c of the gate electrode 50 overlies a different one of the active areas 45 as viewed from above. That is, the four active areas 45 are disposed in regions immediately below the four corner portions 50c of the gate electrode 50. A layout of the active areas 45 and the gate electrode 50 is, for example, one of four-fold symmetry.

In the gate electrode 50, a silicon layer 51 composed of polysilicon is provided, and on the silicon layer 51, a silicide layer 52 composed of a silicide, for example, nickel silicide (NiSi) is provided. Further, on a side surface of the gate electrode 50, a side wall 53 composed of an insulating material is provided. The gate electrode 50 and the side wall 53 are formed by, for example, the same process as that for a gate electrode and a side wall of an MOSFET (not shown) formed in the semiconductor device 2.

Further, in a part of an upper layer portion of the active area 45, an impurity-containing layer 46 is provided. A majority of the impurity-containing layer 46 is disposed in a region other than the region immediately below the gate electrode 50. Further, the impurity-containing layer 46 is spaced from the portion of the active area 45 disposed immediately below the gate electrode 50 in the STI 43, and is in contact with a portion of the active area 45 disposed in a region other than the region immediately below the gate electrode 50 in the STI 43. The conductivity type of the impurity-containing layer 46 is, for example, $p^+$-type. In an upper layer portion of the impurity-containing layer 46, a silicide layer 47 composed of, for example, nickel silicide is provided. The impurity-containing layer 46 is formed by, for example, the same process as that for a source-drain layer of a p-channel type MOSFET (not shown) formed in the semiconductor device 2.

On the silicon substrate 10, an interlayer insulating film 30 is provided so as to cover the gate electrode 50. In the interlayer insulating film 30, a plurality of contacts 61a to 61e extending in the Z-direction are provided. The contacts 61a to 61d are connected to the silicide layers 47 of the active areas 45a to 45d, respectively. The contacts 61e are connected to the silicide layer 52 of the gate electrode 50. Incidentally, in FIG. 4A, in order to make the drawing easy to understand, the illustration of the side wall 53 and the interlayer insulating film 30 are omitted.

Next, an operation of the semiconductor device according to the embodiment will be described.

Figure 5:
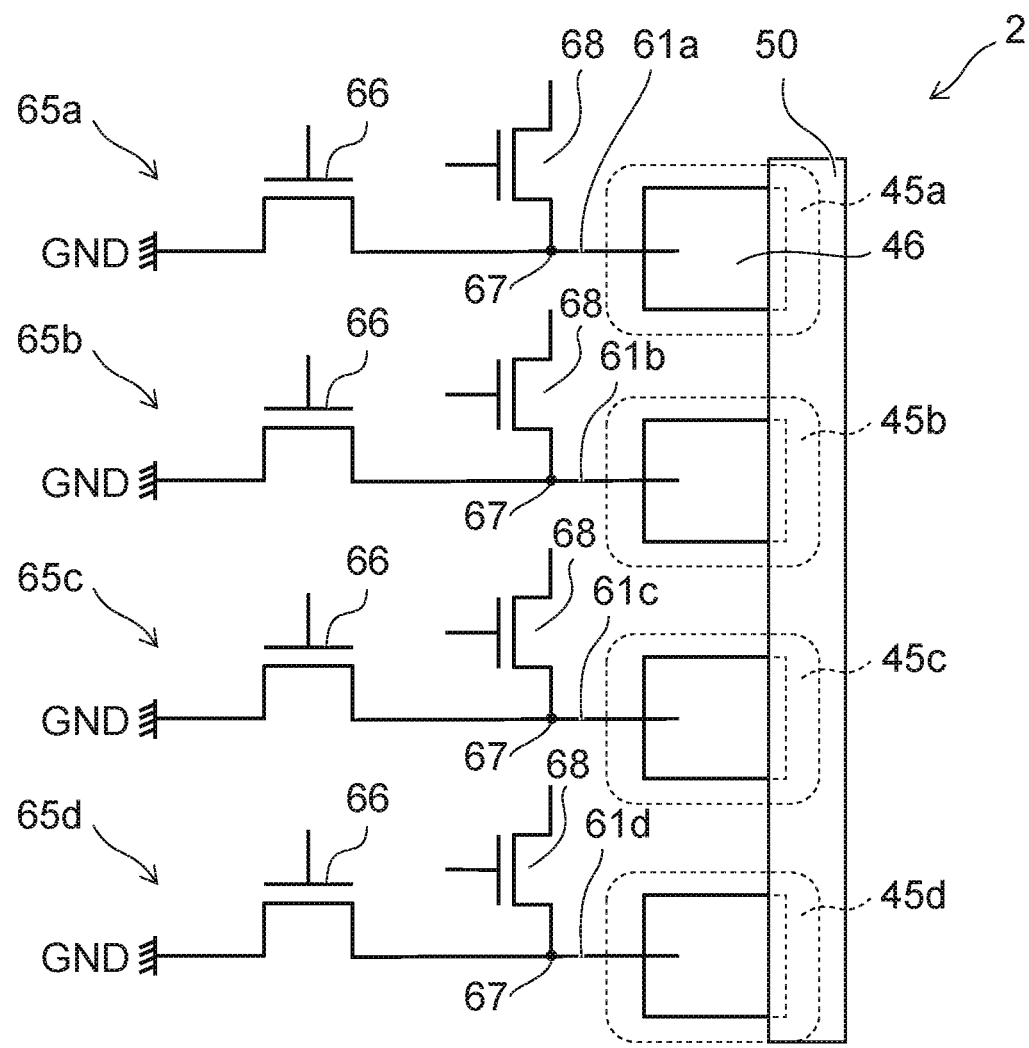
FIG. 5 is a schematic view showing an operation of the semiconductor device according to the second embodiment.

FIG. 5 is a schematic view showing an operation of the semiconductor device according to the embodiment.

In FIG. 5, the gate electrode 50 is deployed, and the active areas 45a to 45d are shown to be arranged in line.

As shown in FIG. 5, in the semiconductor device 2, mutually different circuits 65a to 65d (hereinafter also collectively referred to as "circuit 65") can be connected to the contacts 61a to 61d. In each circuit 65, for example, a transistor for writing 66 is connected between the impurity-containing layer 46 of the active area 45 and a ground potential GND, and a transistor for applying a voltage 68 to the one of a source and a drain which is connected to a connection point 67 between the impurity-containing layer 46 and the transistor for writing 66.

In this manner, by connecting mutually different circuits 65 to the contacts 61a to 61d contacting individual impurity-containing layers 46, four anti-fuse elements can be realized using one gate electrode 50. According to this, for example, by using the anti-fuse element as a write-once memory element, 4-bit information can be stored.

Specifically, for example, the transistor for writing 66 of the circuit 65a is brought to an on state, and the transistor for applying a voltage 68 thereof is brought to an off state, and then, a ground potential is applied to the contact 61a by the circuit 65a. Further, the transistor for writing 66 of each of the circuits 65b to 65d is brought to an off state, the transistor for applying a voltage 68 thereof is brought to an on state, and the contacts 61b to 61c are brought to a floating state. In addition, a positive write potential is applied to the contact 61e.

By doing this, a write voltage is applied between the active area 45a and the gate electrode 50, and an electric field is concentrated between the active area 45a and the corner portion 50c in a region immediately above the active area 45a, and thus, electrical breakdown occurs in the gate insulating film 48 disposed in this portion. Then, metal atoms contained in the silicide layer 52 of the gate electrode 50 move (migrate) along the electric current path, whereby a permanent current path is formed between the gate electrode 50 and the active area 45a. As a result, the anti-fuse element including the active area 45a is short-circuited.

Incidentally, one anti-fuse element may be realized in one gate electrode 50 by short-circuiting the contacts 61a to 61d to each other. In this case, it is only necessary to short-circuit one of the four active areas 45 to the gate electrode 50, and therefore, the reliability of this anti-fuse element is high.

Next, effects of the embodiment will be described.

As shown in FIGS. 4A and 4B, in the semiconductor device 2 according to the embodiment, the gate electrode 50 in a quadrilateral shape as viewed from above and the four active areas 45 are provided, and each corner portion 50c of the gate electrode 50 overlies one of each of the active areas 45. According to this, when a write voltage is applied between an arbitrary active area 45 and the gate electrode 50, an electric field is concentrated in the corner portion 50c which overlies the active area 45, and breakdown can be reliably caused in the gate insulating film 48. Due to this, the reliability of the anti-fuse element of the semiconductor device 2 is high. Further, it is not necessary to excessively increase the write voltage for the purpose of reliably causing breakdown in the gate insulating film 48, and therefore, the size of the semiconductor device 2 can be reduced.

Incidentally, in the embodiment, an example in which the shape of the gate electrode 50 is a quadrangle as viewed from above, and the number of active areas 45 is four is shown, however, the invention is not limited thereto. More generally, when n is an integer of 3 or more, the shape of the gate electrode 50 is an n-gonal (n-sided) shape as viewed from above, the number of active areas 45 is n, and each corner portion 50c of the gate electrode 50 may overlap each active area 45 as viewed from above. According to this, n anti-fuse elements are realized with respect to one gate electrode 50. In this case, in order to make properties of the n anti-fuse elements uniform, the layout of the gate electrode 50 and the active areas 45 is favorably an n-fold symmetry.

The other elements, operation, and effect of the embodiment are the same as those of the above-mentioned first embodiment.

Third Embodiment

Next, a third embodiment will be described.

Figure 6:
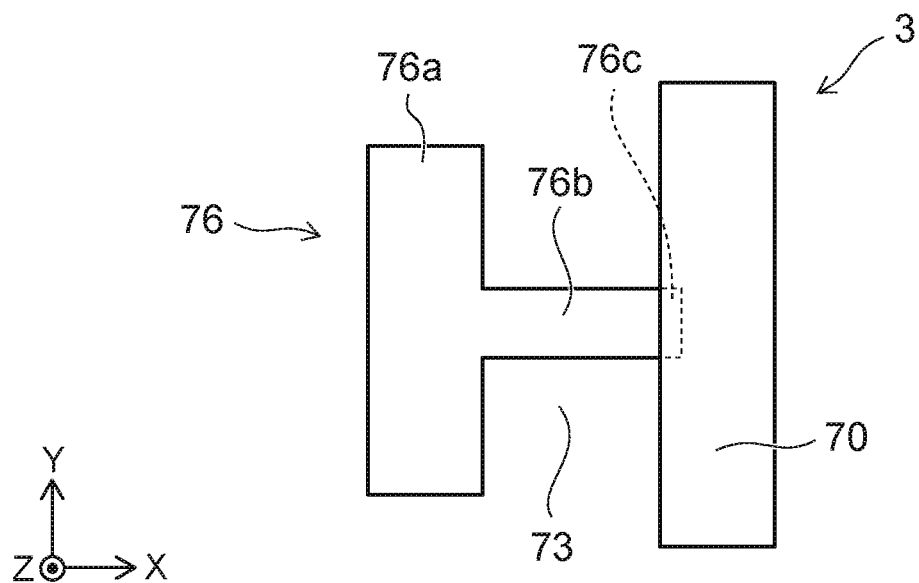
FIG. 6 is a plan view showing a semiconductor device according to a third embodiment.

FIG. 6 is a plan view showing a semiconductor device according to the embodiment.

Incidentally, in FIG. 6, in order to make the drawing easy to understand, only an STI 73, an impurity-containing layer 76, and a gate electrode 70 are shown. The same shall apply also to the below-mentioned FIGS. 7 to 9.

As shown in FIG. 6, in a semiconductor device 3 according to the embodiment, an STI 73 is provided in an upper layer portion of a silicon substrate 10 (see FIG. 1B), and an impurity-containing layer 76 is partitions the STI 73. In the impurity-containing layer 76, a main body portion 76a and a strip-shaped extension portion 76b extending from the main body portion 76a is provided. The main body portion 76a is located spaced from a region immediately below a gate electrode 70, and a tip portion 76c of the extension portion 76b is located in a region immediately below the gate electrode 70. Due to this, two corner portions of the tip portion 76c overlap in the z direction with the location of the gate electrode 70 as viewed from above. Between the impurity-containing layer 76 and the gate electrode 70, a gate insulating film (not shown) is provided.

In the embodiment, the gate electrode 70 overlies the corner portions of the impurity-containing layer 76 in the z direction, and therefore, when a write voltage is applied, breakdown can be reliably caused in the gate insulating film (not shown) in this overlying. The other elements, operation, and effect of the embodiment are the same as those of the above-mentioned first embodiment.

First Variation of Third Embodiment

Next, a first variation of the third embodiment will be described.

Figure 7:
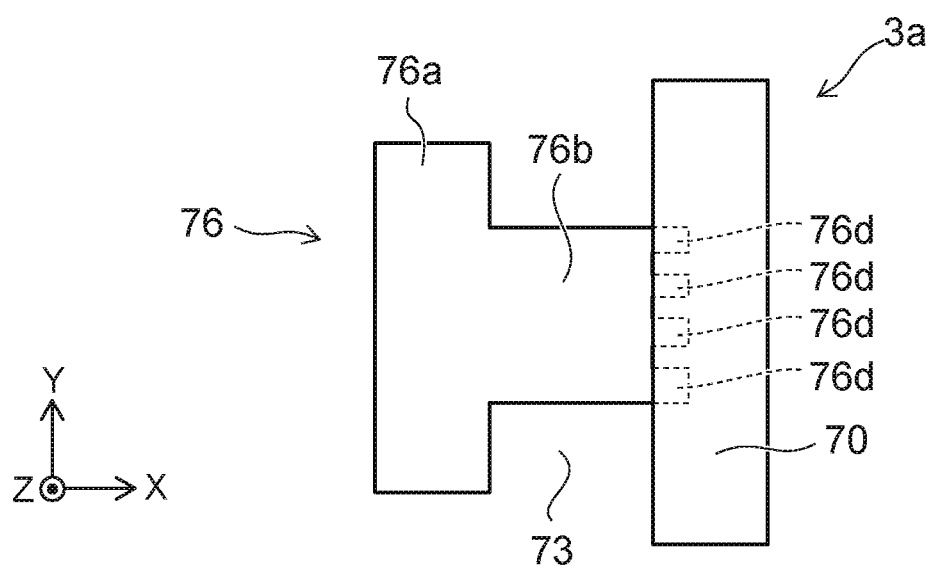
FIG. 7 is a plan view showing a semiconductor device according to a first variation of the third embodiment.

FIG. 7 is a plan view showing a semiconductor device according to the variation.

As shown in FIG. 7, in a semiconductor device 3a according to the embodiment, a plurality of, for example, four protrusion portions 76d are provided in a tip of an extension portion 76b of an impurity-containing layer 76. As viewed from above, a shape of each protrusion portion 76d is a rectangle. As viewed from above, the locations of the protrusion portions 76d overlap with the location of a gate electrode 70 in the z direction, and a portion other than the protrusion portions 76d in the impurity-containing layer 76 does not overlap with the location of the gate electrode 70 in the z direction. Therefore, a total of eight corner portions of the four protrusion portions 76d overlap the gate electrode 70 in the z direction. The other elements, operation, and effect of the variation are the same as those of the above-mentioned third embodiment.

Second Variation of Third Embodiment

Next, a second variation of the third embodiment will be described.

Figure 8:
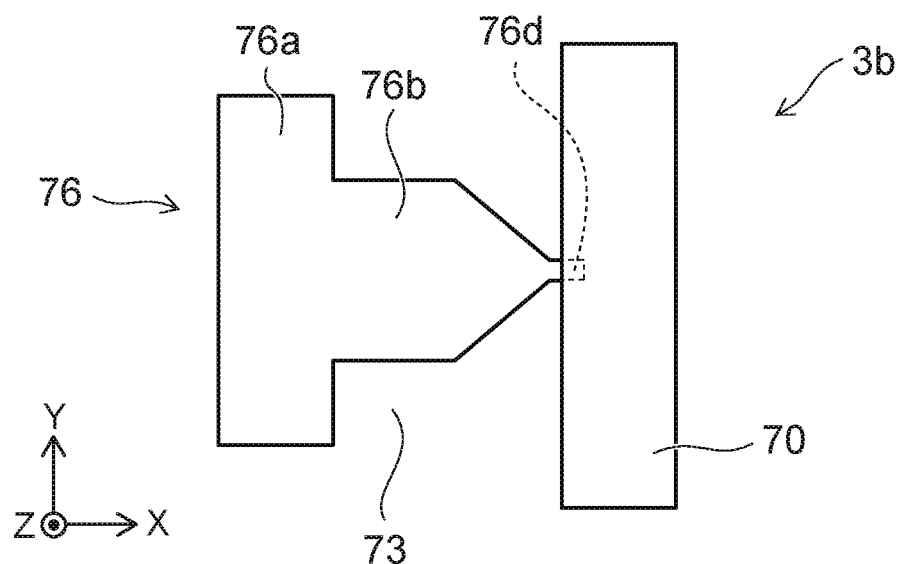
FIG. 8 is a plan view showing a semiconductor device according to a second variation of the third embodiment.

FIG. 8 is a plan view showing a semiconductor device according to the variation of the third embodiment.

As shown in FIG. 8, in a semiconductor device 3b according to the embodiment, in an extension portion 76b of an impurity-containing layer 76, a portion thereof along a side of a gate electrode 70 is inwardly tapered leading to a single protrusion portion 76d provided at the tip thereof. As viewed from above, the protrusion portion 76d overlaps with the location of the gate electrode 70 in the z-direction, and a portion of the impurity containing layer 76 other than the protrusion portion 76d does not overlap with the location of the gate electrode 70 in the z-direction. Therefore, two corner portions of the one protrusion portion 76d overlaps with the position of the gate electrode 70 in the z-direction, i.e., the gate electrode 70 overlies the two corner portions.

According to this variation, the side of the gate electrode 70 in the extension portion 76b tapers inwardly ending in the protrusion portion 76d, and therefore, an electric field is effectively concentrated in the protrusion portion 76d, and breakdown can be more reliably caused in the gate insulating film. The other elements, operation, and effect of the variation are the same as those of the above-mentioned third embodiment.

Third Variation of Third Embodiment

Next, a third variation of the third embodiment will be described.

Figure 9:
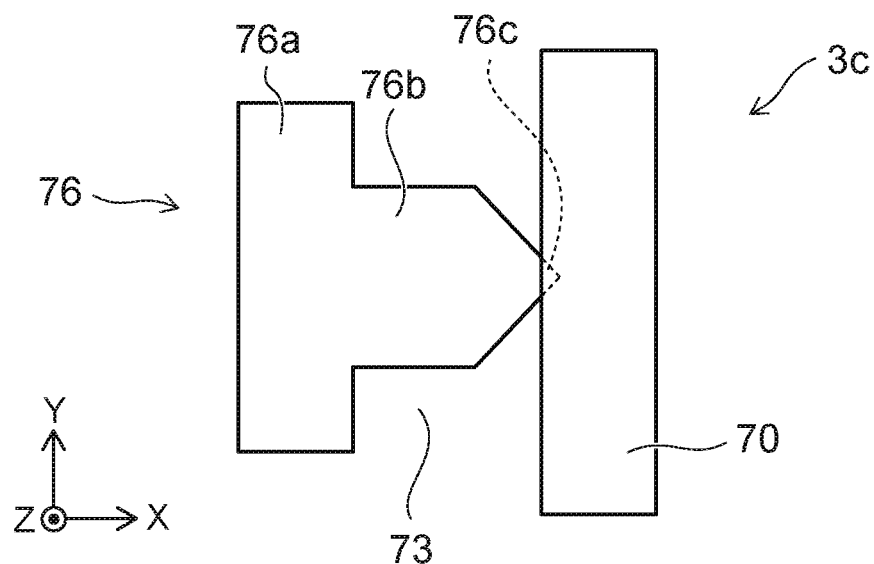
FIG. 9 is a plan view showing a semiconductor device according to a third variation of the third embodiment.

FIG. 9 is a plan view showing a semiconductor device according to this variation of the third embodiment.

As shown in FIG. 9, in a semiconductor device 3c according to the embodiment, a portion on a side of a gate electrode 70 in an extension portion 76b of an impurity-containing layer 76 tapers inwardly and has a triangular shape as viewed from above. Due to this, one corner portion exists in a tip portion 76c of the extension portion 76b. As viewed from above, the tip portion 76c of the impurity-containing layer 76 overlaps with the location of the gate electrode 70 in the z-direction, and the other portion thereof does not overlap with the location of the gate electrode 70 in the z-direction. Therefore, one corner portion of one extension portion 76b underlies the gate electrode 70.

According to the variation, the portion on a side of the gate electrode 70 in the extension portion 76b of the impurity-containing layer 76 tapers inwardly terminating in the tip portion 76c, and therefore, an electric field is effectively concentrated in the tip portion 76c, and breakdown can be more reliably caused in the gate insulating film. The other elements, operation, and effect of the variation are the same as those of the above-mentioned third embodiment.

According to the embodiments described above, a memory device having stable properties and a method for manufacturing the same can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor device, comprising:
   a semiconductor substrate comprising an upper layer portion;
   a first insulating member located in the upper layer portion of the semiconductor substrate and having a plurality of corner portions;
   a plurality of electrodes located on the semiconductor substrate, wherein each of the electrodes overlies a different one of the corner portions of the first insulating member; and
   an insulating film located between the semiconductor substrate and the electrode.

2. The semiconductor device according to claim 1, wherein
   the first insulating member has an n-gonal shape, where n is an integer not less than 3.

3. The semiconductor device according to claim 2, wherein n is 4.

4. The semiconductor device according to claim 1, further comprising an impurity-containing layer located in the upper layer portion in a location spaced from the first insulating member.

5. The semiconductor device according to claim 4, wherein the conductivity type of the impurity-containing layer is different from the conductivity type of the upper layer portion.

6. The semiconductor device according to claim 1, further comprising a second insulating member located in the upper layer portion of the semiconductor substrate and surrounding the first insulating member.

7. The semiconductor device according to claim 1, wherein the electrode further comprises:
   a silicon layer; and
   a silicide layer located on the silicon layer.

\* \* \* \* \*